(12) United States Patent
Kawato et al.

(10) Patent No.: US 10,103,202 B2
(45) Date of Patent: Oct. 16, 2018

(54) ORGANIC ELEMENT

(71) Applicant: Sharp Kabushiki Kaisha, Sakai, Osaka (JP)

(72) Inventors: Shinichi Kawato, Sakai (JP); Katsuhiro Kikuchi, Sakai (JP); Satoshi Inoue, Sakai (JP); Takashi Ochi, Sakai (JP); Yuhki Kobayashi, Sakai (JP); Kazuki Matsunaga, Sakai (JP); Eiichi Matsumoto, Mitsuke (JP); Masahiro Ichihara, Mitsuke (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/317,156

(22) PCT Filed: Jun. 11, 2015

(86) PCT No.: PCT/JP2015/066851
§ 371 (c)(1),
(2) Date: Dec. 8, 2016

(87) PCT Pub. No.: WO2015/190550
PCT Pub. Date: Dec. 17, 2015

(65) Prior Publication Data
US 2017/0125488 A1    May 4, 2017

(30) Foreign Application Priority Data

Jun. 12, 2014  (JP) ................... 2014-121758

(51) Int. Cl.
| | |
|---|---|
| *H01L 27/32* | (2006.01) |
| *H01L 51/52* | (2006.01) |
| *H01L 51/56* | (2006.01) |
| *H01L 51/50* | (2006.01) |
| *H01L 51/00* | (2006.01) |

(52) U.S. Cl.
CPC .......... *H01L 27/3211* (2013.01); *H01L 51/52* (2013.01); *H01L 51/56* (2013.01);
(Continued)

(58) Field of Classification Search
CPC ............. H01L 27/3211; H01L 51/5012; H01L 51/5056; H01L 51/5072; H01L 51/5088; H01L 51/5092; H01L 51/52
See application file for complete search history.

(56) References Cited

U.S. PATENT DOCUMENTS

| | | | |
|---|---|---|---|
| 6,023,073 A | 2/2000 | Strite | |
| 2004/0100190 A1* | 5/2004 | Kim | .................... H01L 51/5012 |
| | | | 313/504 |

(Continued)

FOREIGN PATENT DOCUMENTS

| | | |
|---|---|---|
| JP | 11-504754 A | 4/1999 |
| JP | 2003-229269 A | 8/2003 |

(Continued)

OTHER PUBLICATIONS

Official Communication issued in International Patent Application No. PCT/JP2015/066851, dated Aug. 18, 2015.

*Primary Examiner* — Allan R Wilson
(74) *Attorney, Agent, or Firm* — Keating & Bennett, LLP

(57) ABSTRACT

In an organic EL element including a positive electrode, a negative electrode, and a light emitting layer (recombination layer) provided between the positive electrode and the negative electrode, an electron transport layer and an electron injection layer are provided between the light emitting layer and the negative electrode, and are sequentially arranged in the direction from the light emitting layer to the negative electrode. A hole injection layer and a hole transport layer are provided between the light emitting layer and the positive electrode, and are sequentially arranged in the direction from the positive electrode to the light emitting (Continued)

layer. A buffer layer for suppressing the electron trapping properties is provided between the light emitting layer and the hole transport layer.

13 Claims, 6 Drawing Sheets

(52) U.S. Cl.
CPC ........ *H01L 51/006* (2013.01); *H01L 51/0058* (2013.01); *H01L 51/0072* (2013.01); *H01L 51/0085* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 2251/558* (2013.01)

(56) References Cited

U.S. PATENT DOCUMENTS

| | | | | |
|---|---|---|---|---|
| 2006/0220534 | A1* | 10/2006 | Shibanuma | H01L 51/5092 313/504 |
| 2006/0255367 | A1* | 11/2006 | Yamada | H01L 29/0821 257/197 |
| 2008/0157657 | A1* | 7/2008 | Matsunami | H01L 51/006 313/504 |
| 2009/0096357 | A1 | 4/2009 | Lee et al. | |
| 2011/0057179 | A1* | 3/2011 | Nowatari | H01L 51/5278 257/40 |
| 2012/0193613 | A1* | 8/2012 | Kadoma | C07D 409/10 257/40 |
| 2012/0295379 | A1* | 11/2012 | Sonoda | C23C 14/042 438/34 |
| 2013/0056715 | A1 | 3/2013 | Asami et al. | |
| 2013/0285038 | A1* | 10/2013 | Sonoda | C23C 14/042 257/40 |
| 2015/0144895 | A1* | 5/2015 | Joo | H01L 51/5068 257/40 |

FOREIGN PATENT DOCUMENTS

| | | |
|---|---|---|
| JP | 2006-302637 A | 11/2006 |
| JP | 2009-094456 A | 4/2009 |
| JP | 2013-058562 A | 3/2013 |
| JP | 2013-110073 A | 6/2013 |

\* cited by examiner

ORGANIC ELEMENT

TECHNICAL FIELD

The present invention relates to an organic EL (electroluminescent) element that is used in an organic EL display device or an organic EL illumination device, or to an organic element such as an organic thin film solar cell that includes an active layer composed of an organic compound.

BACKGROUND ART

In recent years, an organic element typified by an OLED (organic EL display) has been designed to include a positive electrode, a negative electrode, and a recombination layer (active layer) provided between the positive electrode and the negative electrode. The recombination layer is composed of an organic compound, and allows electrons and holes (positive holes) to be recombined. In order to improve the function and operating efficiency of the organic element, various layers are provided between the positive electrode and the recombination layer and/or between the negative electrode and the recombination layer.

Specifically, in a conventional organic EL element, as proposed by, e.g., Patent Document 1, a hole injection layer and a hole transport layer are provided between a positive electrode and a light emitting layer (recombination layer), and are sequentially arranged in the direction from the positive electrode to the light emitting layer. In the conventional organic EL element, an electron injection layer and an electron transport layer are provided between a negative electrode and the light emitting layer, and are sequentially arranged in the direction from the negative electrode to the light emitting layer. With this configuration, since holes and electrons are efficiently recombined in the light emitting layer, the luminous efficiency in the light emitting layer can be improved, so that the light emission properties of the organic EL element can also be improved.

PRIOR ART DOCUMENTS

Patent Documents

Patent Document 1: JP 2013-110073 A

DISCLOSURE OF INVENTION

Problem to be Solved by the Invention

However, in the conventional organic EL element (organic element), the function of the light emitting layer (recombination layer) is reduced, which can lead to lower light emission properties of the organic EL element.

Specifically, the conventional organic EL element is produced in the following manner. First, the hole injection layer is formed on the positive electrode by, e.g., a spin coating method. Then, the hole transport layer, the light emitting layer, the electron transport layer, the electron injection layer, and the negative electrode are formed in this order on the hole injection layer by a vacuum deposition method. In the conventional organic EL element, the hole transport layer, the light emitting layer, the electron transport layer, the electron injection layer, and the negative electrode are sequentially formed while passing through a plurality of deposition chambers in succession. Therefore, contamination may be present in the light emitting layer of the conventional organic EL element.

More specifically, e.g., grease is applied to the moving parts of the deposition chambers, and some components of the grease may be mixed in the light emitting layer as contamination. In each of the deposition chambers, the temperature is higher in the vicinity of the deposition source. Accordingly, the materials of the organic EL element may be exposed to heat for a long time and deteriorated. Then, the deteriorated materials may be mixed in the light emitting layer as contamination.

In the conventional organic EL element, electrons may be trapped (captured) by contamination in the light emitting layer, particularly at the interface of the light emitting layer facing the positive electrode, that is, in the vicinity of the interface between the light emitting layer and the hole transport layer, depending on the concentration or component of the contamination. This may reduce the efficiency of the recombination of holes and electrons in the light emitting layer. Consequently, the conventional organic EL element can cause low brightness or uneven light emission, and thus have poor light emission properties.

With the foregoing in mind, it is an object of the present invention to provide an organic element that has excellent properties capable of preventing a reduction in the function of the recombination layer.

Means for Solving Problem

To achieve the above object, an organic element of the present invention includes a positive electrode, a negative electrode, and a recombination layer provided between the positive electrode and the negative electrode. A buffer layer for suppressing electron trapping properties is located on the side of the active layer facing the positive electrode or the negative electrode.

In the organic element having the above configuration, even if contamination is present in the recombination layer, the buffer layer can suppress the electron trapping properties due to the contamination. Thus, unlike the conventional example, the organic element can prevent a reduction in the function of the recombination layer and have excellent properties.

In the organic element, it is preferable that the buffer layer is composed of alkali metal, alkaline-earth metal, or organic matter having electron-donating properties.

This can reliably suppress the electron trapping properties.

In the organic element, it is preferable that the buffer layer has a thickness of 0.1 nm to 1 nm.

In this case, it is possible to prevent the influence of the buffer layer on the properties of the organic element, and also to prevent a reduction in the properties of the organic element.

In the organic element, it is preferable that the thickness of the buffer layer is not more than 5% of the thickness of the recombination layer.

In this case, it is possible to reliably prevent the influence of the buffer layer on the properties of the organic element, and also to reliably prevent a reduction in the properties of the organic element.

The organic element may include a light emitting layer as the recombination layer. An electron transport layer and an electron injection layer may be provided between the light emitting layer and the negative electrode, and be sequentially arranged in the direction from the light emitting layer to the negative electrode. The buffer layer, a hole transport layer, and a hole injection layer may be provided between the light emitting layer and the positive electrode, and be sequentially arranged in the direction from the light emitting layer to the positive electrode.

In this case, the organic EL element can prevent a reduction in the function of the light emitting layer and have excellent light emission properties.

The organic element may include a red light emitting layer for emitting red light, a green light emitting layer for emitting green light, and a blue light emitting layer for emitting blue light as the light emitting layer. The positive electrode may include a positive electrode for red that corresponds to the red light emitting layer, a positive electrode for green that corresponds to the green light emitting layer, and a positive electrode for blue that corresponds to the blue light emitting layer.

In this case, the organic EL element can emit light of different colors without using a color filter and have excellent light emission properties.

In the organic element, the red light emitting layer, the green light emitting layer, and the blue light emitting layer may share at least the buffer layer of the negative electrode, the electron injection layer, the electron transport layer, the buffer layer, the hole transport layer, and the hole injection layer.

This makes it easy to produce the organic EL element that can emit light of different colors and have excellent light emission properties.

The organic element may include more than one group of the electron injection layer, the electron transport layer, the light emitting layer, the buffer layer, the hole transport layer, and the hole injection layer that are provided between the positive electrode and the negative electrode.

In this case, since the organic EL element can have a tandem structure, the organic El element with high quality and low power consumption can easily be provided.

In the organic element, it is preferable that the buffer layer and the electron transport layer are composed of the same material.

In this case, the organic EL element having a simple structure and excellent light emission properties can easily be provided.

The organic element may include a power-generating layer as the recombination layer. The power-generating layer may include a p-type organic semiconductor located on the side facing the positive electrode, an n-type organic semiconductor located on the side facing the negative electrode, and an i-type organic semiconductor located between the p-type organic semiconductor and the n-type organic semiconductor. The buffer layer may be provided between the i-type organic semiconductor and the n-type organic semiconductor.

This can provide an organic thin film solar cell that has excellent power generation properties capable of preventing a reduction in the function of the power-generating layer.

The organic element may include a p-type organic semiconductor located on the side facing the positive electrode, an n-type organic semiconductor located on the side facing the negative electrode, and an i-type organic semiconductor located between the p-type organic semiconductor and the n-type organic semiconductor as the recombination layer. The buffer layer may be provided between the i-type organic semiconductor and the p-type organic semiconductor.

This can provide an organic thin film diode that has excellent properties capable of preventing a reduction in the function of the recombination layer.

Effects of the Invention

The present invention can provide an organic element that has excellent properties capable of preventing a reduction in the function of the recombination layer.

DESCRIPTION OF THE INVENTION

Figure 1:
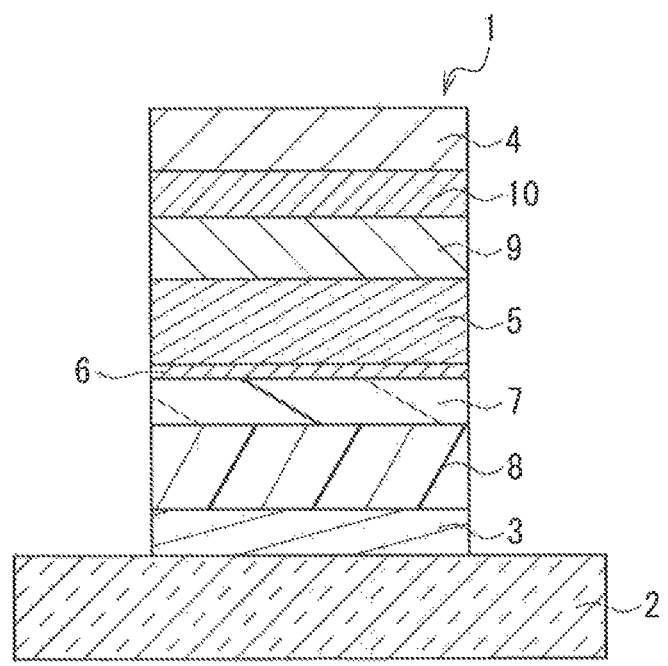
FIG. 1 is a cross-sectional view illustrating a configuration of an organic EL element of Embodiment 1 of the present invention.

Hereinafter, preferred embodiments of an organic element of the present invention will be described with reference to the drawings. In the following description, the present invention is applied to an organic EL element, an organic thin film solar cell, or an organic thin film diode. The size and size ratio of each of the constituent members in the drawings may not exactly represent those of the actual constituent members.

[Embodiment 1]

FIG. 1 is a cross-sectional view illustrating a configuration of an organic EL element of Embodiment 1 of the present invention. In FIG. 1, an organic EL element 1 of this embodiment includes a substrate 2, a positive electrode 3 provided on the substrate 2, and a negative electrode 4 provided above the positive electrode 3. The organic EL element 1 also includes a light emitting layer (recombination layer) 5 provided between the positive electrode 3 and the negative electrode 4. Moreover, a buffer layer 6, a hole transport layer 7, and a hole injection layer 8 are provided between the positive electrode 3 and the light emitting layer 5, and are sequentially arranged in the direction from the light emitting layer 5 to the positive electrode 3. Further, an electron transport layer 9 and an electron injection layer 10 are provided between the negative electrode 4 and the light emitting layer 5, and are sequentially arranged in the direction from the light emitting layer 5 to the negative electrode 4.

The substrate 2 is made of, e.g., glass. The positive electrode 3 is made of, e.g., a transparent electrode material such as ITO. The thickness of the positive electrode 3 is, e.g., about 20 nm to 100 nm.

The negative electrode 4 is made of, e.g., aluminum or silver. The negative electrode 4 has a degree of freedom in thickness. For example, when the organic EL element 1 has a top emission structure, in which light is extracted from the negative electrode 4, it is preferable that the thickness of the negative electrode 4 is generally about several to 30 nm. When the organic EL element 1 has a bottom emission structure, in which light is extracted from the substrate 2, the thickness of the negative electrode 4 may be several tens of nm. The negative electrode 4 may be made of a transparent electrode material such as ITO or IZO.

The light emitting layer 5 is a recombination layer (active layer) in which electrons and holes can be recombined, and contains at least a host and a light emitting dopant. In the light emitting layer 5, e.g., the light emitting dopant material may be either a fluorescent dopant material or a phosphorescent dopant material. Examples of the fluorescent dopant material include a diamine pyrene-based blue delayed fluorescence material. Examples of the phosphorescent dopant material include tris(2-phenylpyridinate)iridium(III) (Ir(ppy)3). A light emitting) host material may be, e.g., 1,3,5-tris(N-phenylbenzimidazole-2-yl)benzene (TPBI). The thickness of the light emitting layer 5 is, e.g., about 40 nm.

The buffer layer 6 is made of alkali metal, alkaline-earth metal, or organic matter having electron-donating properties. Specifically, the alkali metal may be, e.g., lithium, sodium, or cesium. The alkaline-earth metal may be, e.g., magnesium, calcium, strontium, or barium. The organic matter may be, e.g., BPhen (bathophenanthroline). The thickness of the buffer layer 6 is, e.g., 0.1 nm to 1 nm, which is not more than 5% of the thickness of the light emitting layer (recombination layer) 5.

The buffer layer 6 has electron-donating properties and is configured to suppress the electron trapping properties due to contamination in the light emitting layer 5 (as will be described in detail later).

The hole transport layer 7 may be the same as that included in, e.g., a general organic EL element. The hole transport layer 7 is made of, e.g., 4,4'-bis[N-(1-naphthyl)-N-phenyl-amino]-biphenyl (α-NPD). The thickness of the hole transport layer 7 is, e.g., 15 nm.

The hole injection layer 8 is made of, e.g., a phthalocyanine-based material, starburst polyamines, or polyaniline. The thickness of the hole injection layer 8 is, e.g., several tens of nm.

The electron transport layer 9 is made of, e.g., BPhen. The thickness of the electron transport layer 9 is, e.g., 20 nm.

When the buffer layer 6 is composed of BPphen, i.e., the same material as that of the electron transport layer 9, the organic EL element having a simple structure and excellent light emission properties can easily be provided.

The electron injection layer 10 is made of, e.g., metallic lithium, metallic barium, or compounds thereof such as lithium fluoride. The thickness of the electron injection layer 10 is generally very thin and is, e.g., 0.1 nm.

Next, referring to FIGS. 2A to 2D a method for manufacturing the organic EL element 1 of this embodiment will be described in detail.

FIGS. 2A to 2D are diagrams for explaining the manufacturing process of the organic EL element.

Figure 2A:
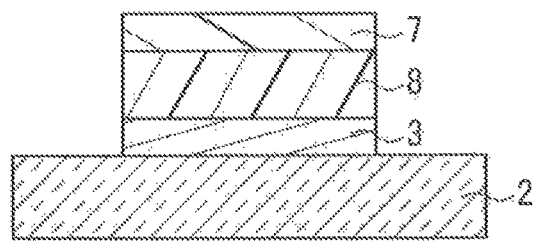
FIG. 2A is a diagram for explaining the manufacturing process of the organic EL element.

As illustrated in FIG. 2A, in the organic EL element 1 of this embodiment, the positive electrode 3, the hole injection layer 8, and the hole transport layer 7 are formed in this order on the substrate 2 by, e.g., a vacuum deposition method. The positive electrode 3, the hole injection layer 8, and the hole transport layer 7 are transferred in sequence to separate deposition chambers placed in a deposition apparatus (not shown), and are sequentially formed in their respective deposition chambers.

Figure 2B:
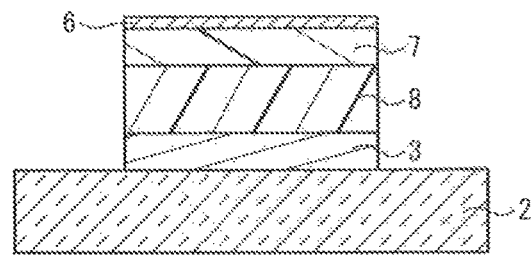
FIG. 2B is a diagram for explaining the manufacturing process of the organic EL element.

Then, as illustrated in FIG. 2B, the buffer layer 6 is formed on the hole transport layer 7 by, e.g., a vacuum deposition method. The buffer layer 6 is formed in a dedicated deposition chamber placed in the deposition apparatus. Other than the above description, the buffer layer 6 may be formed using a dedicated deposition source that is provided in the deposition chamber for the hole transport layer 7 or in a deposition chamber for the light emitting layer 5.

Figure 2C:
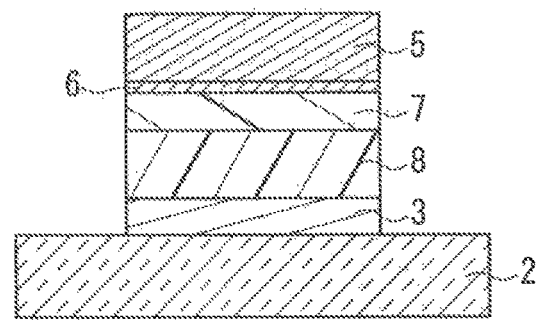
FIG. 2C is a diagram for explaining the manufacturing process of the organic EL element.

Subsequently, as illustrated in FIG. 2C, the light emitting layer 5 is formed on the buffer layer 6 by, e.g., a vacuum deposition method. The light emitting layer 5 is formed in a dedicated deposition chamber placed in the deposition apparatus.

Figure 2D:
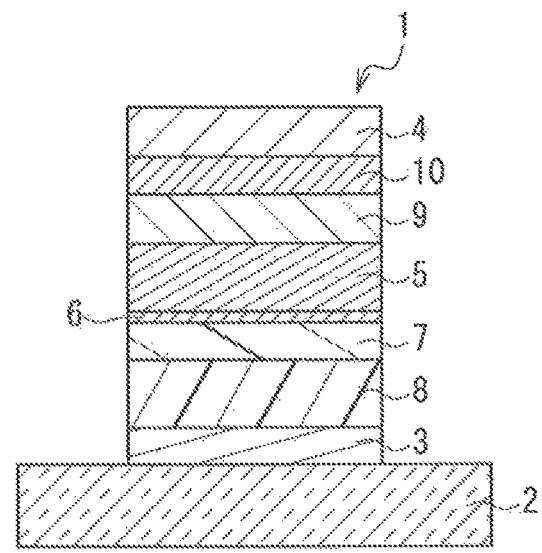
FIG. 2D is a diagram for explaining the manufacturing process of the organic EL element.

Next, as illustrate in FIG. 2D, the electron transport layer 9, the electron injection layer 10, and the negative electrode 4 are formed in this order on the light emitting layer 5 by, e.g., a vacuum deposition method. The electron transport layer 9, the electron injection layer 10, and the negative electrode 4 are transferred in sequence to separate deposition chambers placed in the deposition apparatus (not shown), and are sequentially formed in their respective deposition chambers.

Thus, the organic EL element 1 of this embodiment is produced in the above manufacturing process.

Next, referring to FIGS. 3A and 3B, the function of the buffer layer 6 will be described in detail.

Figure 3A:
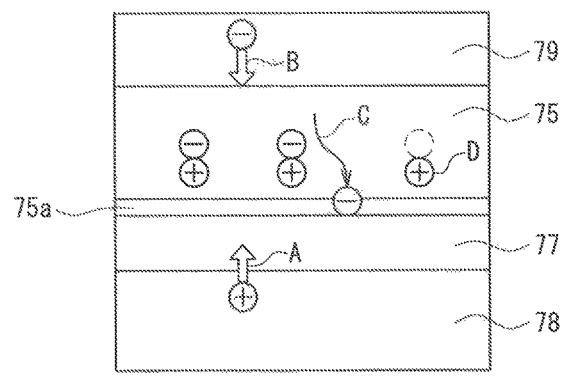
FIG. 3A is a diagram for explaining an operation of a comparative example.

FIG. 3A is a diagram for explaining an operation of a comparative example. FIG. 3B is a diagram for explaining an operation of a product of this embodiment.

In FIG. 3A, the comparative example is a product corresponding to a conventional organic EL element. The comparative example includes a hole injection layer 78, a hole transport layer 77, a light emitting layer 75, and an electron transport layer 79 that are laminated. In the comparative example, a region 75a including contamination is present in the light emitting layer 75 and located in the vicinity of the interface between the light emitting layer 75 and the hole transport layer 77.

In the comparative example, holes that have been injected from a positive electrode (not shown) flow from the hole injection layer 78 to the hole transport layer 77 so as to move toward the light emitting layer 75, as indicated by the arrow A in FIG. 3A. Moreover, electrons that have been injected from a negative electrode (not shown) flow through the electron transport layer 79 so as to move toward the light emitting layer 75, as indicated by the arrow B in FIG. 3A. Then, most of the electrons and the holes are recombined in the light emitting layer 75, resulting in a light emitting phenomenon.

However, in the comparative example, some electrons may be trapped (captured) by the contamination in the region 75a, as indicated by the arrow C in FIG. 3A, depending on the concentration or component of the contamination. Consequently, some holes cannot be recombined, as indicated by D in FIG. 3A.

If the recombination of electrons and holes is inhibited in the light emitting layer 75, as shown in the comparative example, the organic EL element can have a reduced life and poor light emission properties such as low brightness or uneven light emission.

Figure 3B:
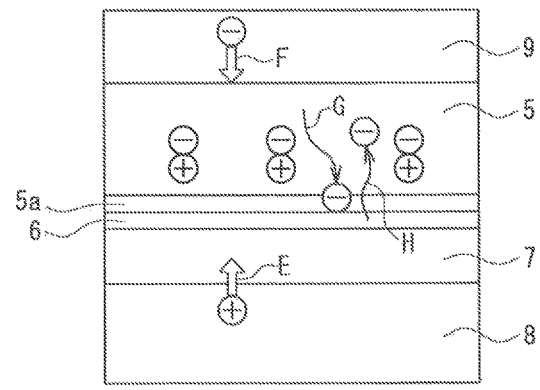
FIG. 3B is a diagram for explaining an operation of a product of this embodiment.

In the product of this embodiment, holes that have been injected from the positive electrode (not shown) flow from the hole injection layer 8 to the hole transport layer 7 so as to move toward the light emitting layer 5, as indicated by the arrow E in FIG. 3B. Moreover, electrons that have been injected from the negative electrode (not shown) flow through the electron transport layer 9 so as to move toward the light emitting layer 5, as indicated by the arrow F in FIG. 3B. Then, unlike the comparative example, all the electrons and holes can be recombined in the light emitting layer 5, resulting in an appropriate light emitting phenomenon.

In the product of this embodiment, even if a region 5a including contamination is present in the light emitting layer 5 and located in the vicinity of the interface between the light emitting layer 5 and the hole transport layer 7, the buffer layer 6 can prevent the generation of holes that will not be able to be recombined with electrons. Specifically, if some electrons are trapped by the contamination, as indicated by the arrow G in FIG. 3B, the electrons are resupplied to the light emitting layer 5 by the buffer layer 6, as indicated by the arrow H in FIG. 3B, and thus can be recombined with holes.

In the organic EL element 1 of this embodiment having the above configuration, even if contamination is present in the light emitting layer (active layer) 5, the buffer layer 6 can suppress the electron trapping properties due to the contamination. Thus, unlike the conventional example, the organic EL element 1 of this embodiment can prevent a reduction in the function of the light emitting layer 5 and have excellent light emission properties.

In this embodiment, the buffer layer 6 is composed of alkali metal, alkaline-earth metal, or organic matter having electron-donating properties, and therefore can reliably suppress the electron trapping properties.

In this embodiment, since the thickness of the buffer layer 6 is 0.1 nm to 1 nm, it is possible to prevent the influence of the buffer layer 6 on the properties of the organic EL element 1, and also to prevent a reduction in the properties of the organic EL element 1.

In this embodiment, since the thickness of the buffer layer 6 is not more than 5% of the thickness of the light emitting layer 5, it is possible to reliably prevent the influence of the buffer layer 6 on the properties of the organic EL element 1, and also to reliably prevent a reduction in the properties of the organic EL element 1.

[Embodiment 2]

Figure 4:
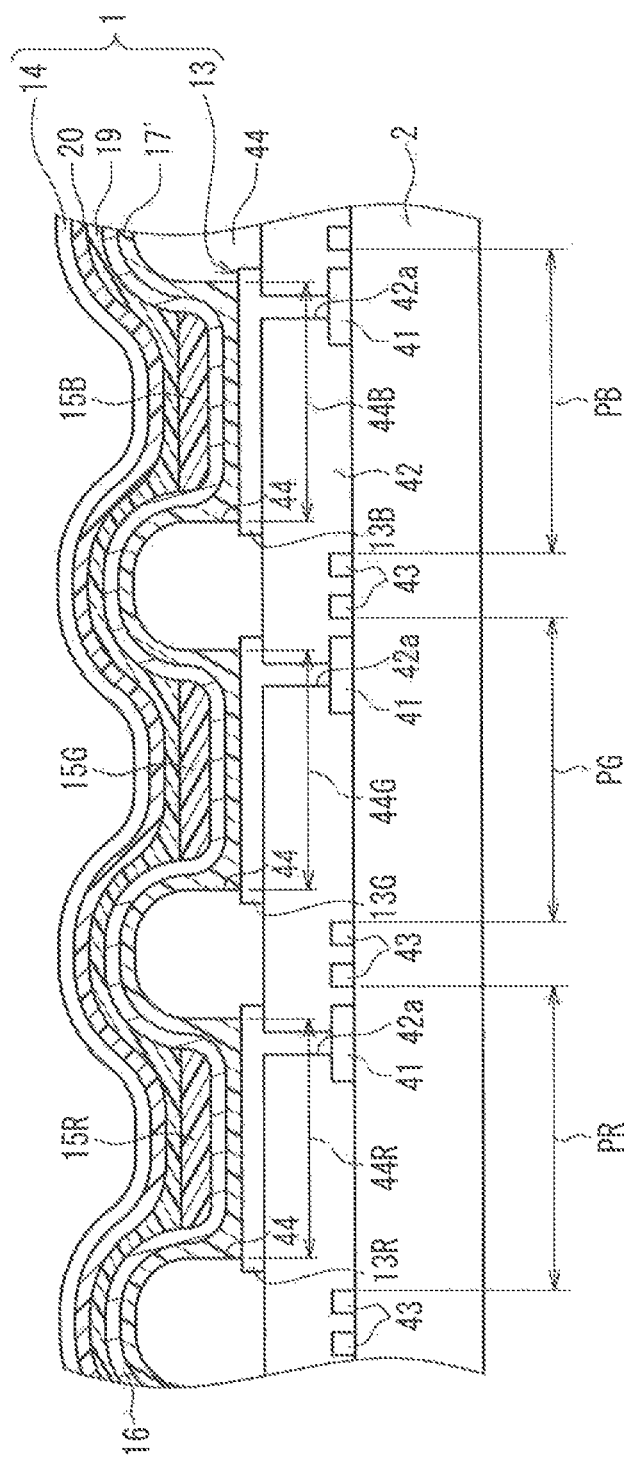
FIG. 4 is a cross-sectional view illustrating a configuration of an organic EL element of Embodiment 2 of the present invention.

FIG. 4 is a cross-sectional view illustrating a configuration of an organic EL element of Embodiment 2 of the present invention.

In FIG. 4, this embodiment mainly differs from Embodiment 1 in that an organic EL element includes a red light emitting layer for emitting red light, a green light emitting layer for emitting green light, and a blue light emitting layer for emitting blue light. The same components as those of Embodiment 1 are denoted by the same reference numerals, and the explanation will not be repeated.

As illustrated in FIG. 4, an organic EL element 1 of this embodiment includes a substrate 2 and a red subpixel PR for emitting red (R) light, a green subpixel PG for emitting green (G) light, and a blue subpixel PB for emitting blue (B) light that are provided on the substrate 2. The RGB subpixels PR, PG, and PB constitute a single pixel.

Moreover, TFTs 41 (i.e., switching elements), lines 43, an interlayer film 42 (i.e., an interlayer insulating film or a planarization film), an edge cover 44, and the like are provided on the substrate 2.

The TFTs 41 function as switching elements that control the light emission of the subpixels PR, PG, and PB, and are provided for each of the subpixels PR, PG, and PB. The TFTs 41 are connected to the lines 43.

The interlayer film 42 also functions as a planarization film and is formed on the entire surface of a display region on the substrate 2 to cover the TFTs 41 and the lines 43.

Positive electrodes 13 are formed on the interlayer 42 so as to correspond to the subpixels PR, PG, and PB, respectively. Specifically, a positive electrode for red 13R is provided for the subpixel PR, a positive electrode for green 13G is provided for the subpixel PG, and a positive electrode for blue 13B is provided for the subpixel PB. The positive electrodes 13R, 13G, and 13B are electrically connected to the TFTs 41 via contact holes 42a in the interlayer film 42.

The edge cover 44 is formed on the interlayer film 42 to cover the pattern edges of the positive electrodes 13. The edge cover 44 functions as an insulating layer to prevent a short circuit between the positive electrodes 13 and a negative electrode 14 of the organic EL element 1. Such a short circuit is caused by the following reasons: (i) An organic EL layer between the positive electrodes 13 and the negative electrode 14 becomes thinner at the pattern edges of the positive electrodes 13; (ii) The electric field concentrates on the pattern edges of the positive electrodes 13.

The edge cover 44 has openings 44R, 44G, and 44B that correspond to the subpixels PR, PG, and PB, respectively. The openings 44R, 44G, and 44B of the edge cover 44 form light emitting regions of the subpixels PR, PG, and PB. In other words, the subpixels PR, PG, and PB are partitioned from each other by the edge cover 44 having insulation properties. The edge cover 44 also functions as an element isolation film.

The organic EL element 1 of this embodiment is a light emitting element that is driven by low voltage direct current and can emit high-intensity light. The organic EL element 1 includes the positive electrodes 13, the negative electrode 14, and the organic EL layer provided between the positive electrodes 13 and the negative electrode 14.

In the organic EL element 1 of this embodiment, the organic EL layer includes a hole injection and transport layer 17', a buffer layer 16, light emitting layers 15R, 15G, and 15B, an electron transport layer 19, and an electron injection layer 20 in this order on the positive electrodes 13.

The hole injection and transport layer 17' has both the function of a hole injection layer and the function of a hole transport layer, and is shared by the subpixels PR, PG, and PB. Similarly, the buffer layer 16, the electron transport layer 19, the electron injection layer 20, and the negative electrode 14 are also shared by the subpixels PR, PG, and PB.

In the organic EL element 1 of this embodiment, the red light emitting layer 15R for emitting red light, the green light emitting layer 15G for emitting green light, and the blue light emitting layer 15B for emitting blue light are provided on the common buffer layer 16. This means that RGB color-coded layers are formed in the organic EL element 1.

Other than the above description, e.g., at least one of the hole injection layer, the hole transport layer, the electron transport layer, the electron injection layer, and the negative electrode may be provided for each color of RGB. As in the case of this embodiment, the organic EL element 1 of Embodiment 1 and an organic EL element 1 of Embodiment 3 (as will be described later) may also include the TFTs 41 or the like.

With the above configuration, this embodiment can have the same effects as those of Embodiment 1. In this embodiment, the red light emitting layer 15R for emitting red light, the green light emitting layer 15G for emitting green light, and the blue light emitting layer 15B for emitting blue light are provided along with the positive electrode for red 13R, the positive electrode for green 13G, and the positive electrode for blue 13G. Thus, the organic EL element 1 of this embodiment can emit light of different colors without using a color filter and have excellent light emission properties.

In this embodiment, the RGB light emitting layers 15R, 15G, and 15B share at least the buffer layer of the negative electrode, the electron injection layer, the electron transport layer, the buffer layer, the hole transport layer, and the hole injection layer. This makes it easy to produce the organic EL element 1 that can emit light of different colors and have excellent light emission properties.

[Embodiment 3]

Figure 5:
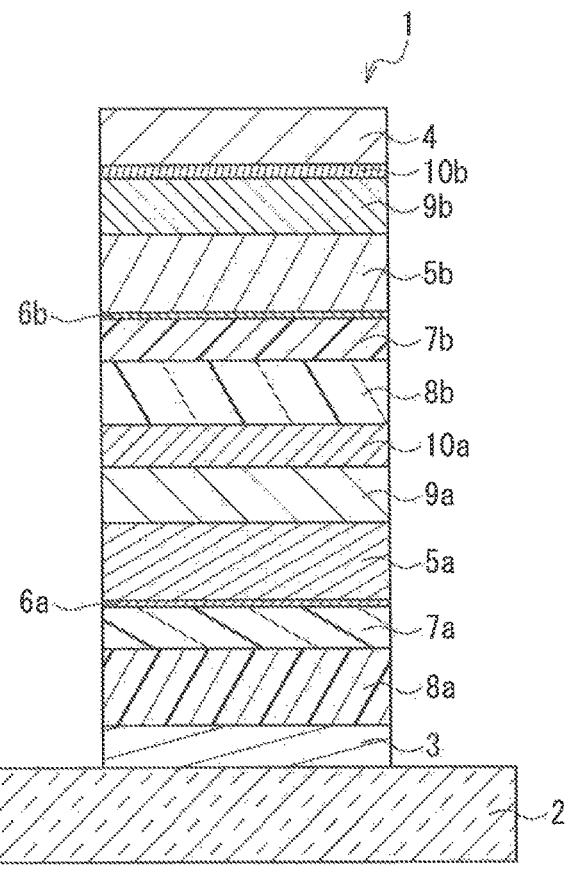
FIG. 5 is a cross-sectional view illustrating a configuration of an organic EL element of Embodiment 3 of the present invention.

FIG. 5 is a cross-sectional view illustrating a configuration of an organic EL element of Embodiment 3 of the present invention.

In FIG. 5, this embodiment mainly differs from Embodiment 1 in that an organic EL element includes more than one group of an electron injection layer, an electron transport layer, a light emitting layer, a buffer layer, a hole transport layer, and a hole injection layer that are provided between a positive electrode and a negative electrode. The same components as those of Embodiment 1 are denoted by the same reference numerals, and the explanation will not be repeated.

As illustrated in FIG. 5, an organic EL element 1 of this embodiment includes a substrate 2, a positive electrode 3 provided on the substrate 2, and a first hole injection layer 8a and a first hole transport layer 7a that are sequentially formed on the positive electrode 3. Moreover, a first buffer layer 6a, a first light emitting layer 5a, a first electron transport layer 9a, and a first electron injection layer 10a are sequentially formed on the first hole transport layer 7a.

Further, a second hole injection layer 8b and a second hole transport layer 7b are sequentially formed on the first electron injection layer 10a. A second buffer layer 6b, a second light emitting layer 5b, a second electron transport layer 9b, and a second electron injection layer 10b are sequentially formed on the second hole transport layer 7b, and a negative electrode 4 is provided on the second electron injection layer 10b. The organic EL element 1 of this embodiment has a tandem structure in which two groups of the electron injection layer, the electron transport layer, the light emitting layer, the buffer layer, the hole transport layer, and the hole injection layer are provided between the positive electrode 3 and the negative electrode 4.

With the above configuration, this embodiment can have the same effects as those of Embodiment 1. In this embodiment, since the organic EL element has a tandem structure, the organic EL element 1 with high quality and low power consumption can easily be provided.

[Embodiment 4]

Figure 6:
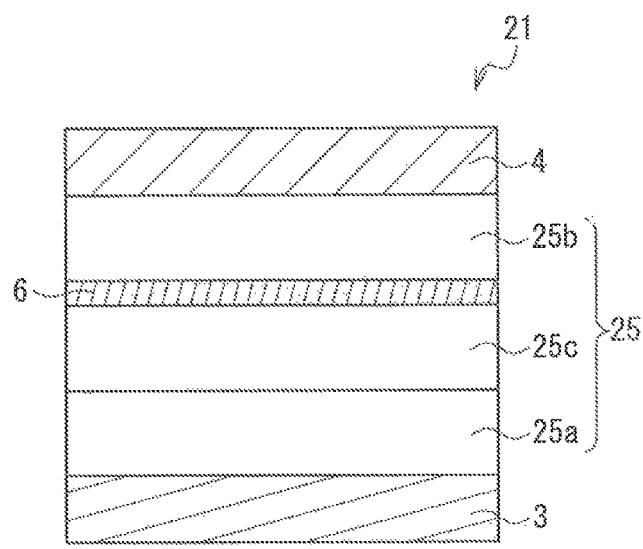
FIG. 6 is a cross-sectional view illustrating a configuration of an organic thin film solar cell of Embodiment 4 of the present invention.

FIG. 6 is a cross-sectional view illustrating a configuration of an organic thin film solar cell of Embodiment 4 of the present invention.

In FIG. 6, this embodiment mainly differs from Embodiment 1 in that it is directed to an organic thin film solar cell having a power-generating layer as an active layer. The same components as those of Embodiment 1 are denoted by the same reference numerals, and the explanation will not be repeated.

As illustrated in FIG. 6, an organic thin film solar cell 21 of this embodiment includes a positive electrode 3, a negative electrode 4, and a power-generating layer (recombination layer) 25 provided between the positive electrode 3 and the negative electrode 4.

The power-generating layer 25 includes a p-type organic semiconductor 25a, an i-type organic semiconductor 25c, and an n-type organic semiconductor 25b. The p-type organic semiconductor 25a is connected to the positive electrode (p-type electrode) 3. The n-type organic semiconductor 25b is connected to the negative electrode (n-type electrode) 4. A buffer layer 6 is interposed between the i-type organic semiconductor 25c and the n-type organic semiconductor 25b.

Similarly to Embodiment 1, the buffer layer 6 is made of alkali metal, alkaline-earth metal, or organic matter having electron-donating properties. Therefore, even if contamination is present in the i-type organic semiconductor 25c, and electrons that have been generated in the power-generating layer 25 are trapped (captured) by the contamination, the buffer layer 6 allows the electrons to flow to the negative electrode 4 because of its electron-donating properties.

Consequently, this embodiment can prevent a reduction in the power generation function of the power generating layer 25, and provide the organic thin film solar cell 21 having high power generation performance.

[Embodiment 5]

Figure 7:
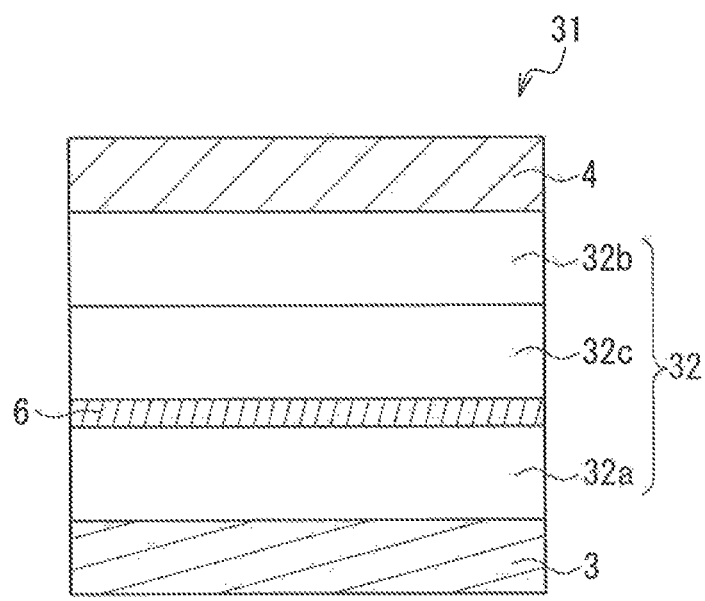
FIG. 7 is a cross-sectional view illustrating a configuration of an organic thin film diode of Embodiment 5 of the present invention.

FIG. 7 is a cross-sectional view illustrating a configuration of an organic thin film diode of Embodiment 5 of the present invention.

In FIG. 7, this embodiment mainly differs from Embodiment 1 in that it is directed to an organic thin film diode from which no light is emitted. The same components as those of Embodiment 1 are denoted by the same reference numerals, and the explanation will not be repeated.

As illustrated in FIG. 7, an organic thin film diode 31 of this embodiment includes a positive electrode 3, a negative electrode 4, and a recombination layer 32 provided between the positive electrode 3 and the negative electrode 4.

The recombination layer 32 includes a p-type organic semiconductor 32a, an i-type organic semiconductor 32c, and an n-type organic semiconductor 32b. The p-type organic semiconductor 32a is connected to the positive electrode (p-type electrode) 3. The n-type organic semiconductor 32b is connected to the negative electrode (n-type electrode) 4. A buffer layer 6 is interposed between the i-type organic semiconductor 32c and the p-type organic semiconductor 32a.

Similarly to Embodiment 1, the buffer layer 6 is made of alkali metal, alkaline-earth metal, or organic matter having electron-donating properties. Therefore, even if contamination is present in the p-type organic semiconductor 32a, and electrons that have flown in the recombination layer 32 are trapped (captured) by the contamination, the buffer layer 6 allows the electrodes to be supplied and recombined with holes because of its electron donating properties.

Consequently, this embodiment can prevent a reduction in the recombination function of the recombination layer 32, and provide the organic thin film diode 31 having excellent diode performance.

The above embodiments are all illustrative and not restrictive. The technical scope of the present invention is defined by the appended claims, and all changes that come within the range of equivalency of the claims are intended to be embraced therein.

For example, in the above description, the organic EL element, the organic thin film solar cell, or the organic thin film diode is used as an organic element. However, the present invention is not particularly limited, and may use any organic element including a positive electrode, a negative electrode, and a recombination layer provided between the positive electrode and the negative electrode, in which a buffer layer for suppressing the electron trapping properties is located on the side of the recombination layer facing the positive electrode or the negative electrode.

In the above description, the buffer layer is in the form of a layer with a uniform thickness. However, the buffer layer of the present invention is not limited thereto. The buffer layer is formed to be very thin by a vacuum deposition method, and therefore may be in the form of islands with a non-uniform thickness.

In Embodiments 1 to 3, the light emitting layer, the hole transport layer, and the electron transport layer are provided separately. However, the organic EL element of the present invention is not limited thereto, and may use, e.g., a light emitting layer that also serves as a hole transport layer or a light emitting layer that also serves as an electron transport layer.

INDUSTRIAL APPLICABILITY

The present invention is useful for an organic element that has excellent properties capable of preventing a reduction in the function of the recombination layer.

DESCRIPTION OF REFERENCE NUMERALS

1 Organic EL element (organic element)
3, 13R, 13G, 13B Positive electrode
4, 14 Negative electrode
5, 15R, 15G, 15B, 5a, 5b Light emitting layer (recombination layer)
6, 16, 6a, 6b Buffer layer
7, 17', 7a, 7b Hole transport layer
8, 17', 8a, 8b Hole injection layer
9, 19, 9a, 9b Electron transport layer
10, 20, 10a, 10b Electron injection layer
21 Organic thin film solar cell
25 Power-generating layer (recombination layer)
31 Organic thin film diode
32 Recombination layer

The invention claimed is:

1. An organic element comprising:
a positive electrode;
a negative electrode; and
a recombination layer provided between the positive electrode and the negative electrode, wherein
a buffer layer for suppressing electron trapping properties is located on a side of the recombination layer facing the positive electrode,
the recombination layer includes a light emitting layer,
an electron transport layer and an electron injection layer are provided between the light emitting layer and the negative electrode, and are sequentially arranged in a direction from the light emitting layer to the negative electrode, and
the buffer layer, a hole transport layer, and a hole injection layer are provided between the light emitting layer and the positive electrode, and are sequentially arranged in a direction from the light emitting layer to the positive electrode.

2. The organic element according to claim 1, wherein the buffer layer is composed of alkali metal, alkaline-earth metal, or organic matter having electron-donating properties.

3. The organic element according to claim 1, wherein the buffer layer has a thickness of 0.1 nm to 1 nm.

4. The organic element according to claim 3, wherein the thickness of the buffer layer is not more than 5% of a thickness of the recombination layer.

5. The organic element according to claim 1, comprising a red light emitting layer for emitting red light, a green light emitting layer for emitting green light, and a blue light emitting layer for emitting blue light as the light emitting layer,
wherein the positive electrode includes a positive electrode for red that corresponds to the red light emitting layer, a positive electrode for green that corresponds to the green light emitting layer, and a positive electrode for blue that corresponds to the blue light emitting layer.

6. The organic element according to claim 5, wherein the red light emitting layer, the green light emitting layer, and the blue light emitting layer share at least the buffer layer of the negative electrode, the electron injection layer, the electron transport layer, the buffer layer, the hole transport layer, and the hole injection layer.

7. The organic element according to claim 1, comprising more than one group of the electron injection layer, the electron transport layer, the light emitting layer, the buffer layer, the hole transport layer, and the hole injection layer that are provided between the positive electrode and the negative electrode.

8. The organic element according to claim 1, wherein the buffer layer and the electron transport layer are composed of the same material.

9. The organic element according to claim 1, comprising a power-generating layer as the recombination layer, the power-generating layer comprising a p-type organic semiconductor located on a side facing the positive electrode, an n-type organic semiconductor located on a side facing the negative electrode, and an i-type organic semiconductor located between the p-type organic semiconductor and the n-type organic semiconductor,
wherein the buffer layer is provided between the i-type organic semiconductor and the n-type organic semiconductor.

10. The organic element according to claim 1, comprising a p-type organic semiconductor located on a side facing the positive electrode, an n-type organic semiconductor located on a side facing the negative electrode, and an i-type organic semiconductor located between the p-type organic semiconductor and the n-type organic semiconductor as the recombination layer,
wherein the buffer layer is provided between the i-type organic semiconductor and the p-type organic semiconductor.

11. The organic element according to claim 1, wherein the buffer layer is configured to resupply an electron to the light emitting layer, the electron being trapped between the light emitting layer and the hole transport layer.

12. The organic element according to claim 1, wherein the buffer layer is composed of BPphen.

13. The organic element according to claim 1, wherein the hole injection layer, the hole transport layer, the buffer layer, the light emitting layer, the electron transport layer, and the electron injection layer are a first hole injection layer, a first hole transport layer, a first buffer layer, a first light emitting layer, a first electron transport layer, and a first electron injection layer, respectively, and a second hole injection layer, a second hole transport layer, a second buffer layer, a second light emitting layer, a second electron transport layer, and a second electron injection layer are sequentially formed on the first electron injection layer.

* * * * *